(12) United States Patent
Kano

(10) Patent No.: US 6,331,716 B1
(45) Date of Patent: *Dec. 18, 2001

(54) VARIABLE CAPACITY DEVICE WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/245,299

(22) Filed: Feb. 5, 1999

(30) Foreign Application Priority Data

Feb. 6, 1998 (JP) .................................. 10-041073
Feb. 24, 1998 (JP) .................................. 10-060494

(51) Int. Cl.[7] .................................................. H01L 29/06

(52) U.S. Cl. .............................. 257/14; 257/15; 257/17; 257/25; 257/598

(58) Field of Search .............................. 257/14, 25, 598, 257/9, 12–15, 17–22, 595, 600, 613–616, 655–657

(56) References Cited

U.S. PATENT DOCUMENTS

| 5,091,756 | 2/1992 | Iga et al. . | |
| 5,278,444 | 1/1994 | Lieneweg et al. . | |
| 5,336,923 | 8/1994 | Geddes et al. . | |
| 5,471,068 | * 11/1995 | Tsuji et al. .............................. | 257/21 |
| 5,737,350 | * 4/1998 | Motoda .................................. | 372/45 |

FOREIGN PATENT DOCUMENTS

| 0 272 885 | 6/1988 | (EP) . |
| 0 471 288 | 2/1992 | (EP) . |
| 0 485 237 | 5/1992 | (EP) . |
| 0 569 258 | 11/1993 | (EP) . |
| 0 874 402 | 10/1998 | (EP) . |
| 0 874 403 | 10/1998 | (EP) . |

OTHER PUBLICATIONS

Takagi et al., Tokyo Institute of Technology, OQE91–13, pp. 73–78, Design of Multi–Quantum Barrier (MQB) and Experimental Verification of MQB Effect, 1991.*

Ng, Complete Guide to Semiconductor Devices, pp. 111–112, 1995.*

A. Rahal, et al., Electronics Letters, vol. 31, No. 23, p. 2022, "Planar Multi–Stack Quantum Barrier Varactor Tripler Evaluation At W–Band", Nov. 9, 1995.

E. Lheurette, et al., Electronics Letters, vol. 32, No. 15, p. 1417, "High Performance InP–Based Heterostructure Barrier Varactors in Single and Stack Configuration", Jul. 18, 1996.

(List continued on next page.)

Primary Examiner—Jerome Jackson, Jr.
Assistant Examiner—Bradley W. Baumeister
(74) Attorney, Agent, or Firm—Oblon, Spivak, McClelland, Maier & Neustadt, P.C.

(57) ABSTRACT

A variable capacity device having an nin, pip, nn⁻p, np⁻p, or nip junction whose middle layer is constituted by a quantum-wave interference layer with plural periods of a first layer W and a second layer B as a unit. The second layer B has a wider band gap than the first layer W. Each thickness of the first layer W and the second layer B is determined by multiplying by an odd number one fourth of a wavelength of a quantum-wave of carriers in each of the first layer W and the second layer B existing around the lowest energy level of the second layer B. A δ layer, for changing energy band suddenly, is formed at interfaces between the first layer W and the second layer B and has a thickness substantially thinner than the first layer W and the second layer B. Plurality of quantum-wave interference units are formed sandwiching carrier accumulation layers in series. Then a voltage-variation rate of capacity of the variable capacity device is improved.

12 Claims, 15 Drawing Sheets

OTHER PUBLICATIONS

M. Yamanashi, Superlattices and Microstructures, vol. 6, No. 4, pp. 403–408, "Ultrafast Modulation Of Quantum States By Virtual Charge Polarization In Based Quantum Well Structures", Jan. 1, 1989.

T. Takagi, et al., Japanese Journal of Applied Physics, vol. 29, No. 11, pp. L1977–L1980, "Potential Barrier Height Analysis Of AlGaInP Multi–Quantum Barrier (MQB)", Nov. 1, 1990.

Akihiko Kikuchi et al, et al., Research Materials of the Institute of Electronics, Information and Communication Engineers, pp. 15–21, Design of AlGaInP Multi–Quantum-Barrier,1991.

Takeshi Takagi, et al., Optical Quantum Electronics, pp. 73–78, "Design Of Multi–Quantum Barrier (MQB) And Experimental Verification Of MQB Effect", 1991.

* cited by examiner

VARIABLE CAPACITY DEVICE WITH QUANTUM-WAVE INTERFERENCE LAYERS

BACKGROUND OF THE INVENTION

1. Field of the Invention

The present invention relates to a variable capacity device having quantum-wave interference layers with an nin or pip junction structure. The present invention also relates to a device with an nn⁻p, np⁻p, or nip junction structure.

2. Description of the Related Art

A voltage-variable capacity device has been known to have a pn junction structure, whose p-layer having a high impurity concentration and n-layer having a low impurity concentration are jointed and form a depletion layer at a boundary region between the p-layer and the n-layer as a capacity device. When a reverse bias voltage is applied to the pn junction of the variable capacity device, a width of the depletion layer is extended and a capacity of the variable capacity device is reduced. Thus the capacity of the device varies according to a value of applied reverse bias voltage.

With respect to the voltage-variable capacity device, it is required to enlarge a variation rate of a capacity value toward an applied voltage. To enlarge the variation rate, forming space distribution in an impurity concentration has been suggested. And to enlarge the voltage variation rate, i.e., voltage-sensitivity, the impurity concentration is required to have a non-linear distribution with respect to a depth.

To obtain the non-linear distribution of the impurity concentration, injecting ions whose acceleration voltage is varied, or a modulation doping in the process of a crystal growth is suggested. But because of a thermal diffusion of impurities, it is difficult to obtain the non-linear distribution as accurate as designed. Thus improvement of the voltage-variation rate of capacity is limited.

SUMMARY OF THE INVENTION

A voltage-variation rate of a depletion layer in the present invention is, therefore, realized not to a variation rate of a distribution of impurity, but to a totally new structure.

It is, therefore, a first object of the present invention to provide a voltage-variable capacity device with high voltage-variation rate, i.e., high voltage sensitivity. It is a second object of the present invention to improve a precision of a capacity controlled by an external voltage. It is a third object to expand a dynamic range of an applied voltage.

In light of these objects a first aspect of the present invention is a variable capacity device with a quantum-wave interference layer, having an nin or pip junction. Each thickness of the first and the second layers is determined by multiplying by an odd number one fourth of a quantum-wave wavelength of carriers, which is conducted in an i-layer, in each of the first and the second layers.

The second aspect of the present invention is to set a kinetic energy of the carriers, which determines the quantum-wave wavelength, near the bottom of a conduction band when the carriers are electrons or near the bottom of a valence band in the second layer, when the carriers are holes.

The third aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent Plank's constant, the effective mass of the conducted carriers in the first layer, effective mass of the conducted carriers in the second layer, the kinetic energy of the carriers at the lowest energy level around the second layer, the potential energy of the second layer relative to the first layer, and odd numbers, respectively.

The fourth aspect of the present invention is a variable capacity device with a quantum-wave interference layer, having an nin or pip junction, and having a plurality of pairs of a first layer and a second layer. The second layer has a wider band gap than the first layer. An i-layer has a partial quantum-wave interference layers $I_k$ with arbitrary periods $T_k$ including a first layer having a thickness of $n_{Wk}\lambda_{Wk}/4$ and a second layer having a thickness of $n_{Bk}\lambda_{Bk}/4$. Each of a plural different values $E_k$, $E_k+V$, $\lambda_{Bk}$, $\lambda_{Wk}$, and $n_{Wk}$, $n_{Bk}$ represent a kinetic energy of carriers conducted in the second layer, a kinetic energy of carriers conducted in the first layer, a quantum-wave wavelength corresponding energies of the second layer and the first layer, and odd numbers, respectively.

The fifth aspect of the present invention is to form a plurality of quantum-wave interference units in an i-layer in series, each unit having a plurality of pairs of first and second layers.

The sixth aspect of the present invention is to form a carrier accumulation layer at interfaces of the quantum-wave interference units, respectively.

The seventh aspect of the present invention is to form a carrier accumulation layer having the same bandwidth as that of the second layer.

The eighth aspect of the present invention is to determine the respective thicknesses of the first layer and the second layer of each quantum-wave interference layer based on a quantum-wave wavelength of carriers, which are conducted when a predetermined electric field is applied to the i-layer.

The ninth aspect of the present invention is to form a δ layer between the first layer and the second layer which sharply varies in band gap energy from the first and second layers and has a thickness substantially thinner than that of the first and the second layers.

The tenth aspect of the present invention is a variable capacity device with a quantum-wave interference layer, having an nn⁻p, np⁻p, or nip junction. Each thickness of the first and the second layers is determined by multiplying by an odd number one fourth of a quantum-wave wavelength of carriers, which are conducted in an n⁻-layer, a p⁻-layer, or an i-layer, in each of the first and the second layers.

The eleventh aspect of the present invention is to set a kinetic energy of the carriers, which determines the quantum-wave wavelength, near the bottom of a conduction band when the carriers are electrons or near the bottom of a valence band in the second layer, when the carriers are holes.

The twelfth aspect of the present invention is is to define each thickness of the first and the second layers as follows:

$$D_W = n_W \lambda_W/4 = n_W h/4[2m_W(E+V)]^{1/2} \quad (3)$$

and $$D_B = n_B \lambda_B/4 = n_B h/4(2m_B E)^{1/2} \quad (4)$$

In Eqs. 1 and 2, h, $m_W$, $m_B$, E, V, and $n_W$, $n_B$ represent Plank's constant, the effective mass of the conducted carrier in the first layer, effective mass of the conducted carrier in the second layer, the kinetic energy of the carriers at the lowest energy level around the second layer, the potential energy of the second layer relative to the first layer, and odd numbers, respectively.

The thirteen aspect of the present invention is a variable capacity device with a quantum-wave interference layer, having an nn⁻p, np⁻p, or nip junction, and having a plurality of pairs of a first layer and a second layer. The second layer has a wider band gap than the first layer. An n⁻-layer, p⁻-layer, or i-layer has a partial quantum-wave interference layers $I_k$ with arbitrary periods $T_k$ including a first layer having a thickness of $n_{Wk}\lambda_{Wk}/4$ and a second layer having a thickness of $n_{Bk}\lambda_{Bk}/4$. Each of a plural different values $E_k$, $E_k+V$, $\lambda_{Bk}$, $\lambda_{Wk}$, and $n_{Wk}$, $n_{Bk}$ represent a kinetic energy of carriers conducted in the second layer, a kinetic energy of carriers conducted in the first layer, a quantum-wave wavelength corresponding energies of the second layer and the first layer, and odd numbers, respectively.

The fourteenth aspect of the present invention is to form a plurality of quantum-wave interference units in an n⁻-layer, p⁻-layer, or i-layer in series, each unit having a plurality of pairs of first and second layers.

The fifteenth aspect of the present invention is to form a carrier accumulation layer at interfaces of the quantum-wave interference units, respectively.

The sixteenth aspect of the present invention is to form a carrier accumulation layer having the same bandwidth as that of the second layer.

The seventeenth aspect of the present invention is to determine thickness of the first layer and the second layer of each quantum-wave interference layer based on a quantum-wave wavelength of carriers, which are conducted when a predetermined electric field is applied to the n⁻-layer, p⁻-layer, or i-layer.

The eighteenth aspect of the present invention is to form a δ layer between the first layer and the second layer which sharply varies in band gap energy from the first and second layers and has a thickness substantially thinner than that of the first and the second layers.

First to Third Aspects of the Invention

The principle of the quantum-wave interference layer of the present invention is explained hereinafter, referring to an nin structure shown in FIG. 3 as an example. FIG. 1A shows a conduction band of a quantum-wave interference layer having a multi-layer structure with plural periods of a first layer W and a second layer B as a unit formed in an i-layer. A band gap of the second layer B is wider than that of the first layer W. Electrons conduct by an external electric field from left to right as shown by an arrow in FIGS. 1A and 1B. Among the electrons, those that exist near the bottom of the conduction band of the second layer B are likely to contribute to conduction. The electrons near the bottom of the conduction band of the second layer B has a kinetic energy E. Accordingly, the electrons in the first layer W have a kinetic energy E+V and are thus accelerated by the potential energy V due to the band gap difference between the first layer W and the second layer B. In other words, electrons that move from the first layer W to the second layer B are decelerated by the potential energy V and return to their original kinetic energy E in the second layer B. As explained above, the kinetic energy of electrons in the conduction band is modulated by the potential energy due to the multi-layer structure.

When the thicknesses of the first layer W and the second layer B are on the order of the quantum-wave wavelength, electrons tend to have characteristics of a wave. The wave length of the electron quantum-wave is calculated by Eqs. 1 and 2 using the kinetic energy of the electron. Further, defining the respective wave number vector of second layer B and first layer W as $K_B$ and $K_W$, reflectivity R of the wave is calculated by:

$$R = (|K_W| - |K_B|)/(|K_W| + |K_B|) \tag{5}$$

$$= \left([m_W(E+V)]^{\frac{1}{2}} - [m_B E]^{\frac{1}{2}}\right) / \left([m_W(E+V)]^{\frac{1}{2}} + [m_B E]^{\frac{1}{2}}\right)$$

$$= \left[1 - (m_B E / m_W(E+V))^{\frac{1}{2}}\right] / \left[1 + (m_B E / m_W(E+V))^{\frac{1}{2}}\right].$$

Further, when $m_B = m_W$, the reflectivity R is calculated by:

$$R = [1-(E/(E+V))^{1/2}]/[1+(E/(E+V))^{1/2}] \tag{6}$$

When $E/(E+V)=x$, Eq. 6 is transformed into:

$$R=(1-x^{1/2})/(1+x^{1/2}) \tag{7}$$

The characteristic of the reflectivity R with respect to the energy ratio x obtained by Eq. 7 is shown in FIG. 2.

When the second layer B and the first layer W have S periods, the reflectivity $R_S$ on the incident face of a quantum-wave is calculated by:

$$R_S = [(1-x^S)/(1+x^S)]^2 \tag{8}$$

When the condition $x \leq 1/10$ is satisfied, $R \geq 0.52$. Accordingly, the relation between E and V is satisfied with:

$$E \leq V/9 \tag{9}$$

Since the kinetic energy E of the conducting electrons in the second layer B exists near the bottom of the conduction band, the relation of Eq. 9 is satisfied and the reflectivity R at the interface between the second layer B and the first layer W becomes 52% or more. Consequently, the multi-layer structure having two kinds of layers with band gaps different from each other enables to reflect quantum-wave of electrons which conduct in an i-layer effectively.

Further, utilizing the energy ratio x enables the thickness ratio $D_B/D_W$ of the second layer B to the first layer W to be obtained by:

$$D_B/D_W = [m_W/(m_B x)]^{1/2} \tag{10}$$

When a voltage applied to the i-layer is enlarged, an effective thickness of the i-layer, or a thickness of a depletion layer, becomes smaller and a capacity of that becomes bigger because of electrons existing in the i-layer, while a reflection of the quantum-wave interference layer is effective and carriers do not pass through the i-layer. FIGS. 1B and 3B show an energy level gradient occurring in the quantum-wave interference layer on the condition that the external voltage is applied to the i-layer. Then E+V and E, kinetic energies of the first layer W and the second layer B, respectively, are enlarged according to progress of the quantum-wave, and each thickness of the first layer W and the second layer B become apart from the most suitable condition to have an effective reflectivity. As a result, when an applied voltage is in a range where a kinetic energy of electrons is not larger than that used to design a thickness of the first layer and the second layer in the quantum-wave interference layer, electrons are reflected and they do not occur electric current. But when an applied voltage is in a range where a kinetic energy of electrons existing in the i-layer is larger than a predetermined value, the electrons in the i-layer are accelerated and moved by an electric field. Then an electric concentration of the i-layer is decreased, an effective thickness of the i-layer, or a thickness of the depletion layer is enlarged, and a capacity of the i-layer becomes smaller.

The thickness of the first layer W and the second layer B are determined for selectively reflecting the holes or the electrons, because of the difference in potential energy between the valence and the conduction bands, and the difference in effective mass of holes and electrons in the first layer W and the second layer B. In other words, the optimum thickness for reflecting electrons is not the optimum thickness for reflecting holes. Accordingly, holes do not exist in the i-layer when the applied voltage is small, and the i-layer is completely depleted with respect to holes.

Fourth Aspect of the Present Invention

FIG. 4 shows a plurality quantum-wave interference units $I_k$ with arbitrary periods $T_k$ including a first layer having a thickness of $D_{Wk}$ and a second layer having a thickness of $D_{Bk}$ and arranged in series, which are formed in an i-layer. Each thickness of the first and the second layers satisfies the formulas:

$$D_{Wk}=n_{Wk}\lambda_{Wk}/4=n_{Wk}h/4[2m_{Wk}(E_k+V)]^{1/2} \quad (11)$$

and $$D_{Bk}=n_{Bk}\lambda_{Bk}/4=n_{Bk}h/4(2m_{Bk}E^k)^{1/2} \quad (12).$$

In Eqs. 11 and 12, $E_k$, $m_{Wk}$, $m_{Bk}$, and $n_{Wk}$ and $n_{Bk}$ represent plural kinetic energy levels of carriers conducted into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole.

Fifth to Seventh Aspects of the Present Invention

To enlarge a capacity of the i-layer effectively, a plural quantum-wave interference units having a plural layer structure is formed concatenated at an arbitrary interval, and a carrier accumulation layer is formed between each of the quantum-well interference layers to confine carriers. And in one aspect of the present invention, a bandwidth of the carrier accumulation layer is equal to that of the second layer.

FIGS. 6A to 6C show a band structure of the i-layer. Each quantum-wave interference units $A_1$ to $A_4$ is formed at an arbitrary interval, and each carrier accumulation layers $C_1$ to $C_3$ is formed between the quantum-wave interference units. Electrons existing in the i-layer are confined effectively by the carrier accumulation layers $C_1$ to $C_3$, and a capacity of the i-layer is enlarged. When an applied voltage is increased, a quantum-wave wavelength of electrons existing in each quantum-wave interference units $A_1$ to $A_4$ does not satisfy a condition to reflect electrons, which are accelerated to flow by an electric field of the i-layer. Accordingly, an electron concentration of each carrier accumulation layers $C_1$ to C3 is decreased, and the capacity of i-layer becomes smaller. Thus controlling the capacity is possible by applying an external voltage.

Eighth Aspect of the Present Invention

When a value of an electric field applied to the i-layer is fixed at a predetermined value, a thickness of the first layer and the second layer of each quantum-well interference layer is determined based on a quantum-wave wavelength of conducted carriers. FIGS. 6A to 6C show an example when an applied voltage is enlarged from $V_1$ to $V_3$. The i-layer can be formed so that each quantum-wave interference units $A_1$ to $A_4$ has the biggest reflectivity at the predetermined applied voltage V. The capacity around the predetermined applied voltage V shows the largest value at this time.

Ninth Aspect of the Present Invention

The ninth aspect of the present invention is to form a δ layer at the interface between the first layer W and the second layer B. The δ layer has a thickness substantially thinner than both of the first layer W and the second layer B and sharply varies the energy band profile of the device. The reflectivity R of the interface is determined by Eq. 7. By forming the δ layer, the potential energy V of an energy band becomes larger and the value x of Eq. 7 becomes larger. Accordingly, the reflectivity R becomes larger.

Variations are shown in FIGS. 5A to 5C. The δ layer may be formed on both ends of every first layer W as shown in FIGS. 5A to 5C. In FIG. 5A, the δ layers are formed so that an energy level higher than that of the second layer B may be formed. In FIG. 5B, the δ layers are formed so that an energy level lower than that of the first layer W may be formed. In FIG. 5C, the δ layers are formed so that a band bottom higher than that of the second layer B and a band bottom lower than that of the first layer W may be formed. As an alternative to each of the variations shown in FIG. 5A to 5C, the δ layer can be formed on one end of every first layer W.

Alternatively, the i-layer can be an pip-type and carriers can be holes.

Tenth to Twelfth Aspects of the Present Invention

The principle of the quantum-wave interference layer of the present invention is explained hereinafter, referring to an nn⁻p structure shown in FIGS. 10A to 10C as an example. FIG. 1A shows a conduction band of a quantum-wave interference layer having a multi-layer structure with plural periods of a first layer W and a second layer B as a unit formed in an n⁻layer. A band gap of the second layer B is wider than that of the first layer W. Electrons conduct by an external electric field from left to right as shown by an arrow in FIGS. 1A and 1B. Among the electrons, those that exist near the bottom of the conduction band of the second layer B are likely to contribute to conduction. The electrons near the bottom of the conduction band the second layer B has a kinetic energy E. Accordingly, the electrons in the first layer W have a kinetic energy E+V and are thus accelerated by the potential energy V due to the band gap difference between the first layer W and the second layer B. In other words, electrons that move from the first layer W to the second layer B are decelerated by the potential energy V and return to their original kinetic energy E in the second layer B. As explained above, the kinetic energy of electrons in the conduction band is modulated by the potential energy due to the multi-layer structure.

When the thicknesses of the first layer W and the second layer B are on the order of the quantum-wave wavelength, electrons tend to have characteristics of a wave. The wave length of the electron quantum-wave is calculated by Eqs. 3 and 4 using the kinetic energy of the electron. Further, defining the respective wave number vector of second layer B and first layer W as $K_B$ and $K_W$, reflectivity R of the wave is calculated by:

$$R = (|K_W| - |K_B|)/(|K_W| + |K_B|) \quad (13)$$

$$= \left([m_W(E+V)]^{\frac{1}{2}} - [m_B E]^{\frac{1}{2}}\right) / \left([m_W(E+V)]^{\frac{1}{2}} + [m_B E]^{\frac{1}{2}}\right)$$

$$= \left[1 - (m_B E/m_W(E+V))^{\frac{1}{2}}\right] / \left[1 + (m_B E/m_W(E+V))^{\frac{1}{2}}\right].$$

Further, when $m_B=m_W$, the reflectivity R is calculated by:

$$R=[1-(E/(E+V))^{1/2}]/[1+(E/(E+V))^{1/2}] \quad (14).$$

When $E/(E+V)=x$, Eq. 14 is transformed into:

$$R=(1-x^{1/2})/(1+x^{1/2}) \quad (15).$$

The characteristic of the reflectivity R with respect to the energy ratio x obtained by Eq. 15 is shown in FIG. 2.

When the second layer B and the first layer W have S periods, the reflectivity $R_S$ on the incident face of a quantum-wave is calculated by:

$$R_S=[(1-x^S)/(1+x^S)]^2 \quad (16)$$

When the condition $x \leq 1/10$ is satisfied, $R \geq 0.52$. Accordingly, the relation between E and V is satisfied with:

$$E \leq V/9 \quad (17).$$

Since the kinetic energy E of the conducting electrons in the second layer B exists near the bottom of the conduction band, the relation of Eq. 17 is satisfied and the reflectivity R at the interface between the second layer B and the first layer W becomes 52% or more. Consequently, the multi-layer structure having two kinds of layers with band gaps different from each other enables to reflect quantum-wave of electrons which conduct in an n⁻-layer effectively.

Further, utilizing the energy ratio x enables the thickness ratio $D_B/D_W$ of the second layer B to the first layer W to be obtained by:

$$D_B/D_W=[m_W/(m_B x)]^{1/2} \quad (18).$$

When a voltage applied to the n⁻-layer is enlarged, an effective thickness of the n⁻-layer, or a thickness of a depletion layer, becomes smaller and a capacity of that becomes bigger because of electrons existing in the n⁻-layer, while a reflection of the quantum-wave interference layer is effective and carriers do not pass through the n⁻-layer. FIGS. 1B and 3B show an energy level gradient occurring in the quantum-wave interference layer on the condition that the external voltage is applied to the n⁻-layer. Then E+V and E, kinetic energies of the first layer W and the second layer, respectively, are enlarged according to progress of the quantum-wave, and each thickness of the first layer W and the second layer B become apart from the most suitable condition to have an effective reflectivity. As a result, when an applied voltage is in a range where a kinetic energy of electrons is not larger than that used to design a thickness of the first layer and the second layer of the quantum-wave interference layer, electrons are reflected and they do not occur electric current. But when an applied voltage is in a range where a kinetic energy of electrons existing in the n⁻-layer is larger than a predetermined value, the electrons in the n⁻-layer are accelerated and moved by an electric field. Then an electric concentration of the n⁻-layer is decreased, an effective thickness of the n⁻-layer, or a thickness of the depletion layer is enlarged, and a capacity of the n⁻-layer becomes smaller.

The thickness of the first layer W and the second layer B are determined for selectively reflecting the holes or the electrons, because of the difference in potential energy between the valence and the conduction bands, and the difference in effective mass of holes and electrons in the first layer W and the second layer B. In other words, the optimum thickness for reflecting electrons is not the optimum thickness for reflecting holes.

Accordingly, holes do not exist in the n⁻-layer when the applied voltage is small, and the n⁻-layer is completely depleted with respect to holes.

A device having an nn⁻p structure is shown in the above aspects. Alternatively, a device having np⁻p or nip structure can be used.

Thirteenth Aspect of the Present Invention

FIG. 4 shows a plurality quantum-wave interference units $I_k$ with arbitrary periods $T_k$ including a first layer having a thickness of $D_{Wk}$ and a second layer having a thickness of $D_{Bk}$ and arranged in series, which are formed in an n⁻layer, a p⁻layer, or an i-layer.

Each thickness of the first and the second layers satisfies the formulas:

$$D_{Wk}=n_{Wk}\lambda_{Wk}/4=n_{Wk}h/4[2m_{Wk}(E_k+V)]^{1/2} \quad (19)$$

and $$D_{Bk}=n_{Bk}\lambda_{Bk}/4=n_{Bk}h/4(2m_{Bk}E^k)^{1/2} \quad (20).$$

In Eqs. 19 and 20, $E_k$, $m_{Wk}$, $m_{Bk}$, and $n_{Wk}$ and $n_{Bk}$ represent plural kinetic energy levels of carriers conducted into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole.

Fourteenth Aspect of the Present Invention

To enlarge a capacity of the n⁻-layer, the p⁻layer, or the i-layer effectively, a plurality of quantum-wave interference units having a plural layer structure is formed concatenated at an arbitrary interval, i.e., in series, and a carrier accumulation layer is formed between each of the quantum-well interference layers to confine carriers. And in one aspect of the present invention, a bandwidth of the carrier accumulation layer is equal to that of the second layer.

FIGS. 11 and 15 show a band structure of the n⁻layer, the p⁻layer, or the i-layer. Each quantum-wave interference units $G_1$ to $G_4$ is formed at an arbitrary interval, and each carrier accumulation layers $C_1$ to $C_3$ is formed between the quantum-wave interference units. Electrons existing in the n⁻layer, the p⁻layer, or the i-layer are confined effectively by the carrier accumulation layers $C_1$ to $C_3$, and a capacity of the device is enlarged. When an applied voltage is increased, a quantum-wave wavelength of electrons existing in each quantum-wave interference units $G_1$ to $G_4$ does not satisfy a condition to reflect electrons, which are accelerated to flow by an electric field of the n⁻layer, the p⁻layer, or the i-layer. Accordingly, an electron concentration of each carrier accumulation layers $C_1$ to $C_3$ is decreased, and the capacity of the n⁻layer, the p⁻layer, or the i-layer becomes smaller. Thus controlling the capacity is possible by applying an external voltage.

Seventeenth Aspect of the Present Invention

When a value of an electric field applied to the n⁻layer, the p⁻layer, or the i-layer is fixed at a predetermined value, a thickness of each of the first layer and the second layer in quantum-well interference layers is determined based on a quantum-wave wavelength of conducted carriers. FIGS. 11 and 15 show an example when an applied voltage is enlarged from $V_1$ to $V_3$. The n⁻layer, the p⁻layer, or the i-layer can be formed so that each quantum-wave interference units $G_1$ to $G_4$ has the biggest reflectivity at the predetermined applied voltage V. The capacity around the predetermined applied voltage V shows the largest value at this time.

Eighteenth Aspect of the Present Invention

The eighteenth aspect of the present invention is to form a δ layer at the interface between the first layer W and the second layer B. The δ layer has a thickness substantially thinner than both of the first layer W and the second layer B and sharply varies the energy band profile of the device. The reflectivity R of the interface is determined by Eq. 15. By forming the δ layer, the potential energy V of an energy band becomes larger and the value x of Eq. 15 becomes larger. Accordingly, the reflectivity R becomes larger.

Variations are shown in FIGS. 5A to 5C. The δ layer may be formed on both ends of every first layer W as shown in FIGS. 5A to 5C. In FIG. 5A, the δ layers are formed so that an energy level higher than that of the second layer B may be formed. In FIG. 5B, the δ layers are formed so that an energy level lower than that of the first layer W may be formed. In FIG. 5C, the δ layers are formed so that a band bottom higher than that of the second layer B and a band bottom lower than that of the first layer W may be formed. As an alternative to each of the variations shown in FIGS. 5A to 5C, the δ layer can be formed on one end of every first layer W.

This explanation is applied to a device having an nn⁻p, np⁻p, or nip structure. And it is applicable to the case that holes are conduction carriers.

BRIEF DESCRIPTION OF THE DRAWING

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIGS. 6A–6C are explanatory views showing the energy diagrams of the i-layer of the diode according to the present invention;

DETAILED DESCRIPTION OF THE INVENTION

The invention will be more fully understood by reference to the following examples.

EXAMPLE 1

Figure 7:
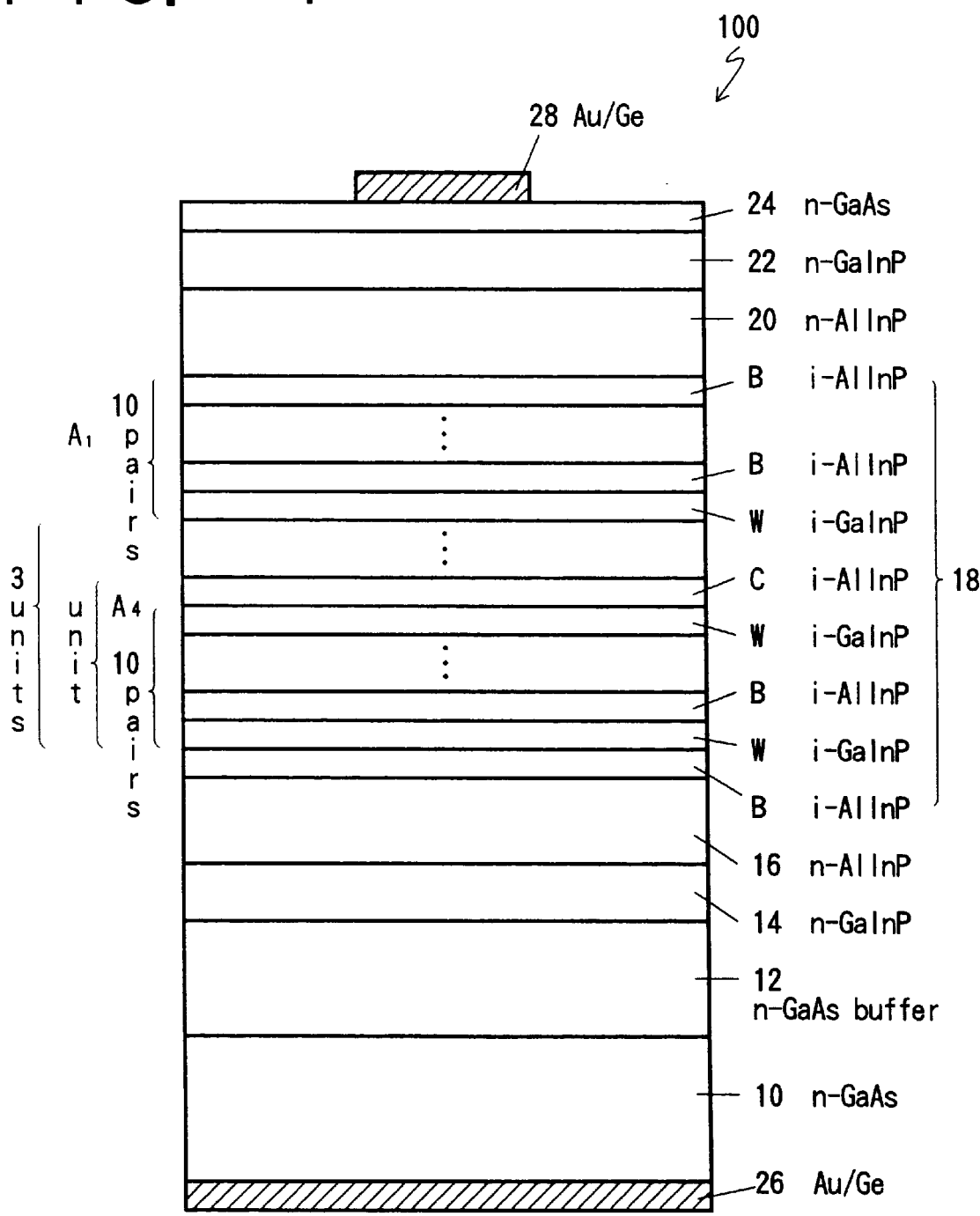
FIG. 7 is a sectional view showing a first exemplary structure of a nin variable capacity device 100 in Example 1.

FIG. 7 is a sectional view of a variable capacity device 100 in which a quantum-wave interference layer is formed in an i-layer. The variable capacity device 100 has a substrate 10 made of gallium arsenide (GaAs). A GaAs buffer layer 12 of n-type conduction, having a thickness generally of 0.3 μm and an electron concentration of $2 \times 10^{18}/cm^3$, is formed on the substrate 10. An n-$Ga_{0.51}In_{0.49}P$ contact layer 14 of n-type conduction, having a thickness generally of 0.13 μm and electron concentration of $2 \times 10^{18}/cm^3$, is formed on the buffer layer 12. An n-$Al_{0.51}In_{0.49}P$ n-layer 16 of n-type conduction, having a thickness generally of 0.2 μm and an electron concentration of $1 \times 10^{18}/cm^3$, is formed on the contact layer 14. A non-doped i-layer 18 is formed on the n-layer 16. A $Al_{0.51}In_{0.49}P$ n-layer 20 of n-type conduction, having a thickness generally of 0.2 μm and an electron concentration of $1 \times 10^{18}/cm^3$, is formed on the i-layer 18. A n-$Ga_{0.51}In_{0.49}P$ second contact layer 22 of n-type conduction, having a thickness generally of 0.13 μm and an electron concentration of $2 \times 10^{18}/cm^3$, is formed on the n-layer 20. An n-GaAs first contact layer 24 of n-type conduction, having a thickness generally of 0.06 μm and an electron concentration of $2 \times 10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of Au/Ge, having a thickness generally of 0.2 μm, is formed on some portion of the first contact layer 24.

A quantum-wave interference unit $A_1$ having a multi-quantum layer structure with 10 pairs of a non-doped $Ga_{0.51}In_{0.49}P$ first layer W and a non-doped $Al_{0.51}In_{0.49}P$ second layer B is formed in the i-layer 18. $A_2, \ldots, A_4$ are formed like $A_1$, and 4 quantum-wave interference units in total are formed in the i-layer 18.

Figure 8A:
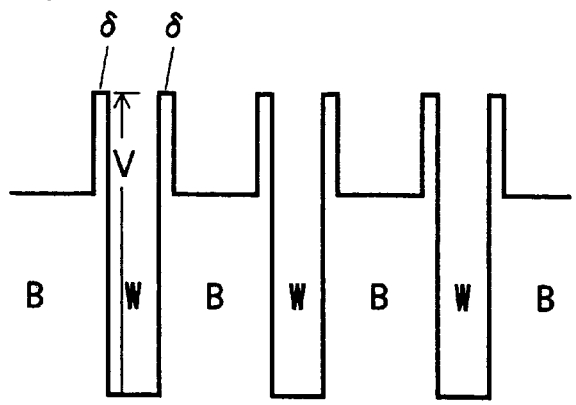
FIGS. 8A–8C are views showing the energy diagrams of a quantum-wave interference layer of the nin variable capacity device in Example 1.
Figure 8B:
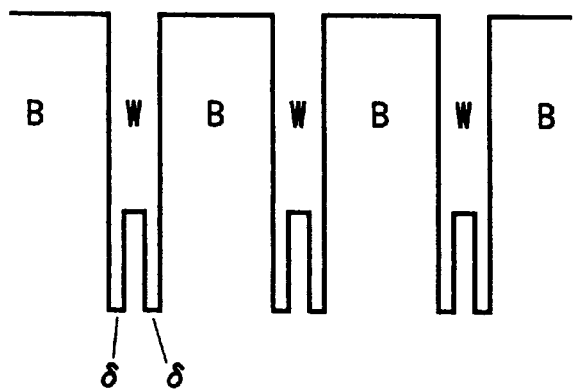
Figure 8C:
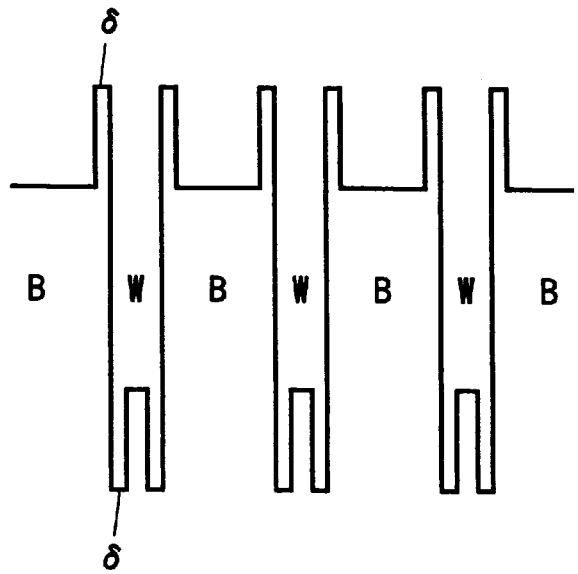

FIGS. 8A to 8C show band structures of the quantum-wave interference layer $A_1$ in detail. The first layer W has a thickness of 5 nm, and the second layer B has a thickness of 7 nm. A non-doped δ layer made of $Al_{0.33}Ga_{0.33}In_{0.33}P$ is formed at each interface between the first layer W and the second layer B.

Non-doped $Al_{0.51}In_{0.49}P$ carrier accumulation layers $C_1$ to $C_3$, having a thickness of 177 nm, is formed between any quantum-wave interference units $A_i$ and $A_{i+1}$, respectively, as shown in FIG. 7. Thicknesses of the first layer W and the second layer are determined according to Eqs. 1 and 2, respectively, on condition that no external voltage is applied thereto.

The second layers B which contact to the n-layer 20 and the p-layer 16 have a thickness of 0.05 μm, respectively. the substrate 10 has a diameter of 2.0 inches and the normal direction of its main surface is offset toward the [011] axis by 15 degree from the (100) plane.

The voltage-variable capacity device 100 was manufactured by gas source molecular beam epitaxial deposition (GS-MBE) which is an epitaxial growth method under extremely high vacuum condition. GS-MBE is different from a conventional MBE which supplies group III and V elements both from said state sources. In GS-MBE, group III elements such as indium (In), gallium (Ga), and aluminum (Al) are supplied from a solid source and group V elements such as arsenic (As) and phosphorous (P) are supplied by heat decomposition of gas material such as $AsH_3$ and $PH_3$.

Figures 6A, 6B, 6C:
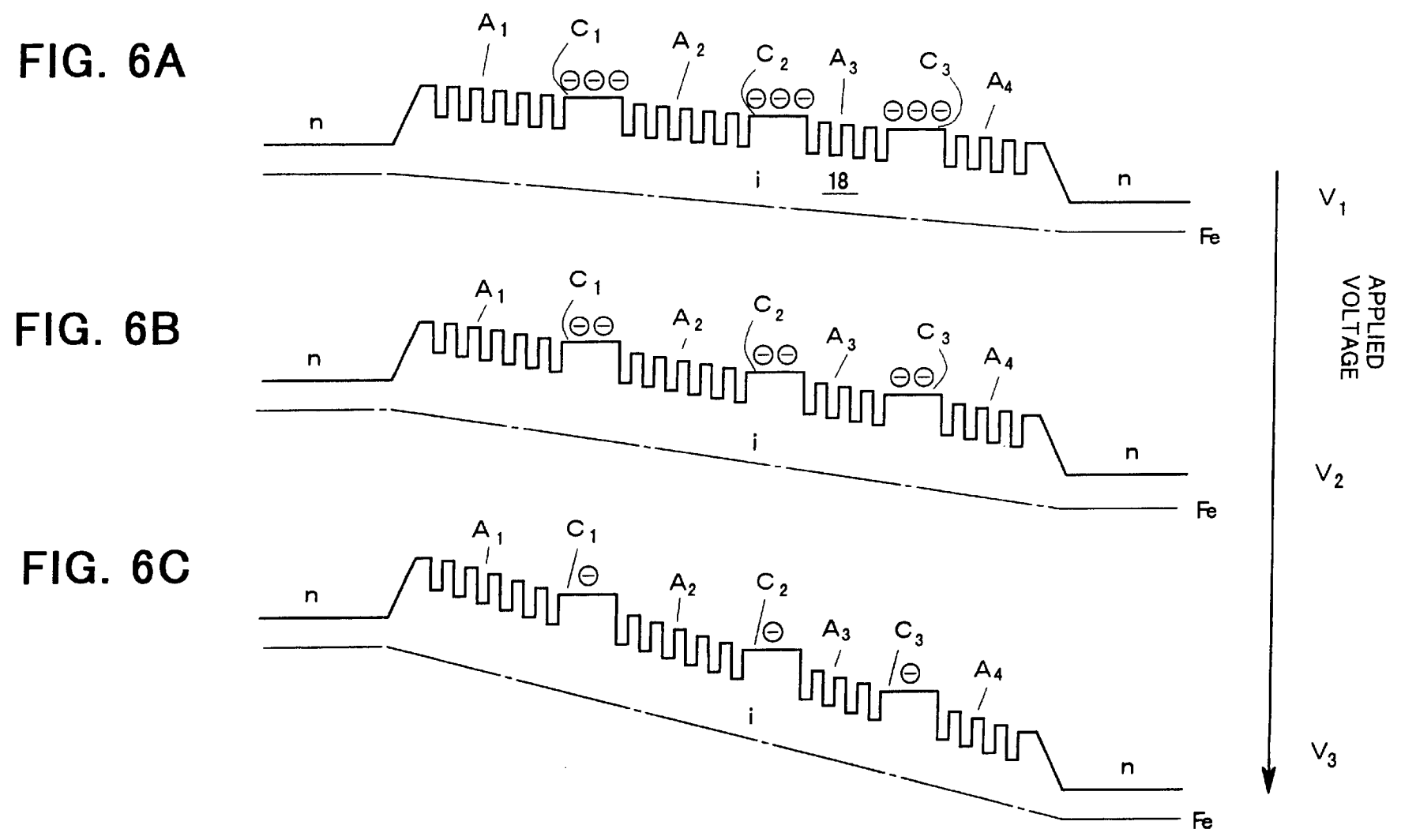

FIG. 6A shows an electric potential gradient occurring in the i-layer 18 as an insulation layer on the condition that an external voltage is applied to the interface between the n-layer 20 and the n-layer 16 of the variable capacity device 100. Although the δ layer is not shown in FIGS. 6A to 6C, it is present at each interface between the first layer W and the second layer B, as shown in FIGS. 8A to 8C. Each quantum-wave interference units $A_1$ to $A_4$ reflects electrons when the external voltage is in the range of 0 to $V_1$ as shown in FIG. 6A. At this stage, electrons which exists in the i-layer 18 are not conducted in the i-layer and are confined in each carrier accumulation layers $C_1$ to $C_3$, respectively. As a result, an effective thickness of a depletion layer is smaller, and an electrostatic capacity between the electrodes 26 and 28 is larger.

When the applied voltage V between the electrodes 26 and 28 become larger, a kinetic energy of electrons become larger and quantum-wavelength become smaller. That becomes not to satisfy the condition in which each quantum-well interference layers $A_1$ to $A_4$ reflects electrons. Accordingly, electrons are conducted and a electron concentration of each carrier accumulation layers $C_1$ to $C_3$ is decreased. Because each carrier accumulation layers $C_1$ to $C_3$ becomes a depletion layer, which means that equivalently the thickness of the depletion layer in the i-layer 18 becomes larger, the capacity of the variable capacity device 100 decreases. Thus by applying a larger applied voltage V, the capacity can be decreased.

Figure 9:
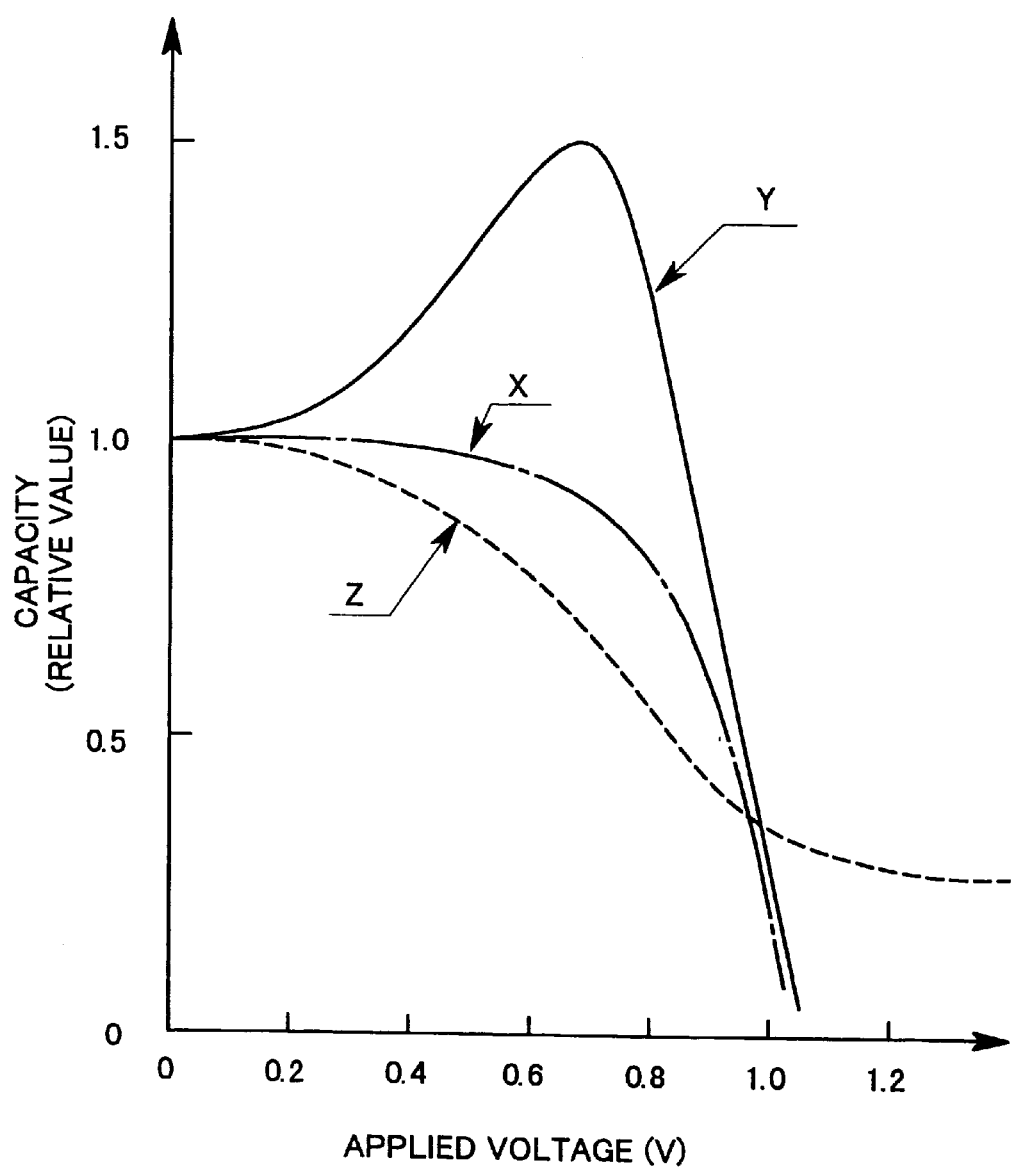
FIG. 9 is a graph showing a voltage characteristic of an alternating current capacity of the variable capacity device in Example 1.
Figure 10A:
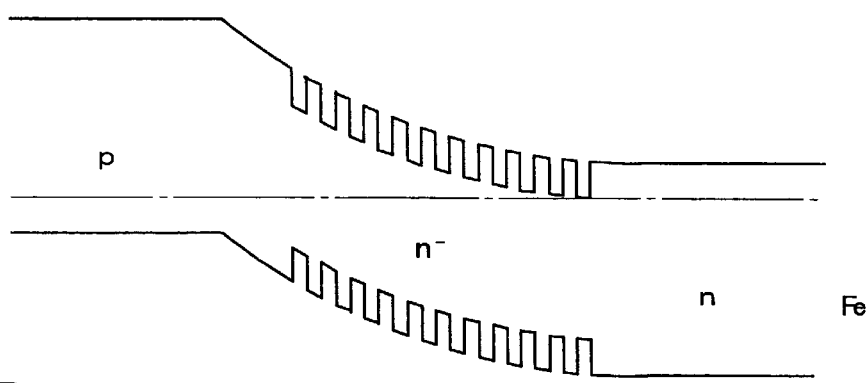
FIGS. 10A–10C are views showing the energy diagram of a quantum-wave interference layer according to the tenth to twelfth aspects of the present invention.
Figure 10B:
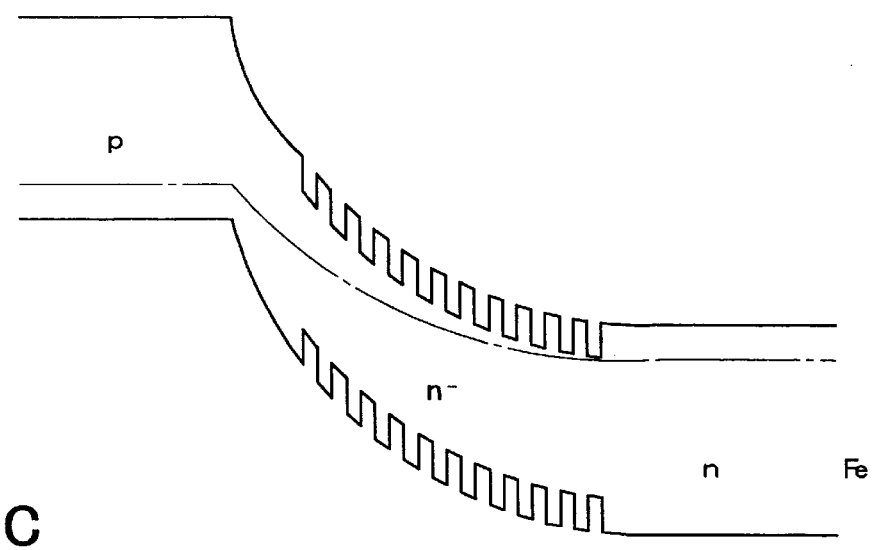
Figure 10C:
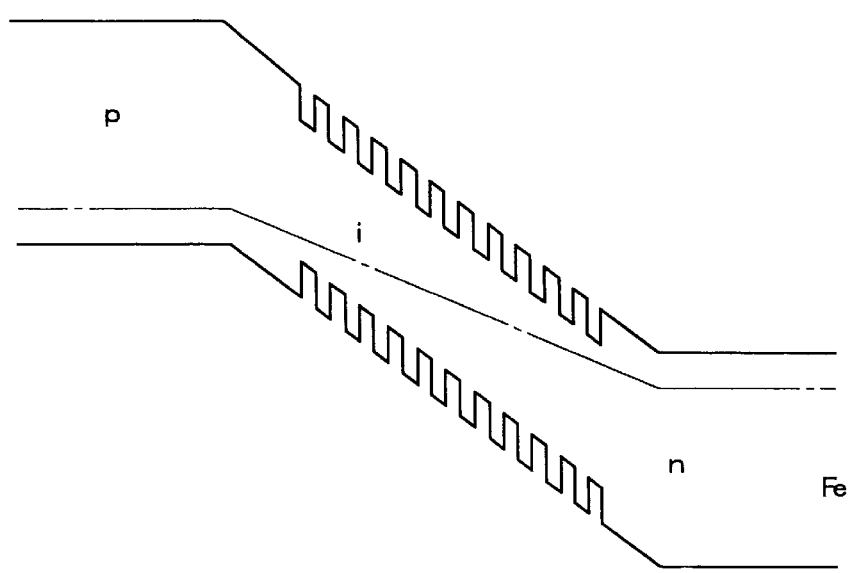

Capacity value with respect to an alternating current when a voltage V was applied as a bias voltage was measured by varying the respective value of the applied voltage V. FIG. 9 shows a result when the alternating currents are fixed at 100 kHz and 1 MHz, respectively. A characteristics X shows a curve when the alternating current is 1 MHz. When the applied voltage V is over 0.6 V, the capacity value of X suddenly drops. A characteristics Y shows a curve when the alternating current is 100 kHz. A peak of capacity value of Y is obtained when the applied voltage V is 0.7 V. And a characteristics Z shows a curve of a voltage-variable capacity device in the prior art. As shown in FIG. 9, it is obvious from the characteristics X and Y that a voltage-variation rate of capacity in the region over 0.8 V is improved compared with that of the prior art. And it is understood that a dynamic range of variable capacity is wider than that of the prior art.

Figure 1A:
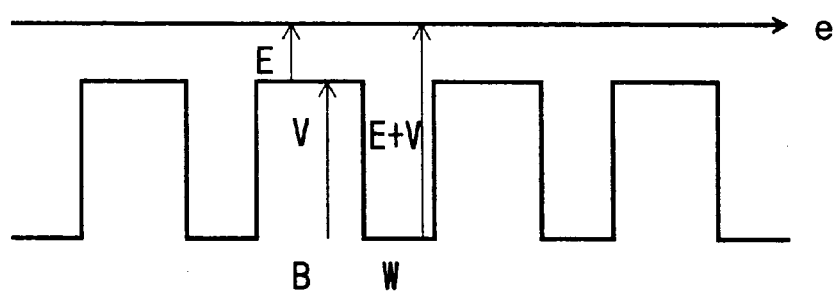
FIGS. 1A and 1B are explanatory views of a conduction band of a multi-layer structure of the present invention.
Figure 1B:
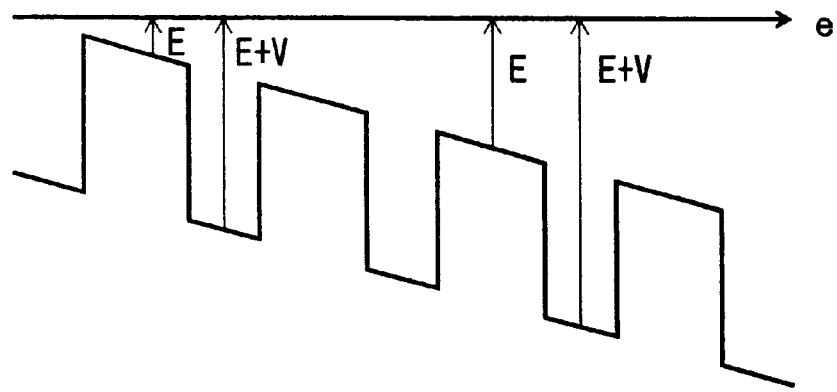
Figure 2:
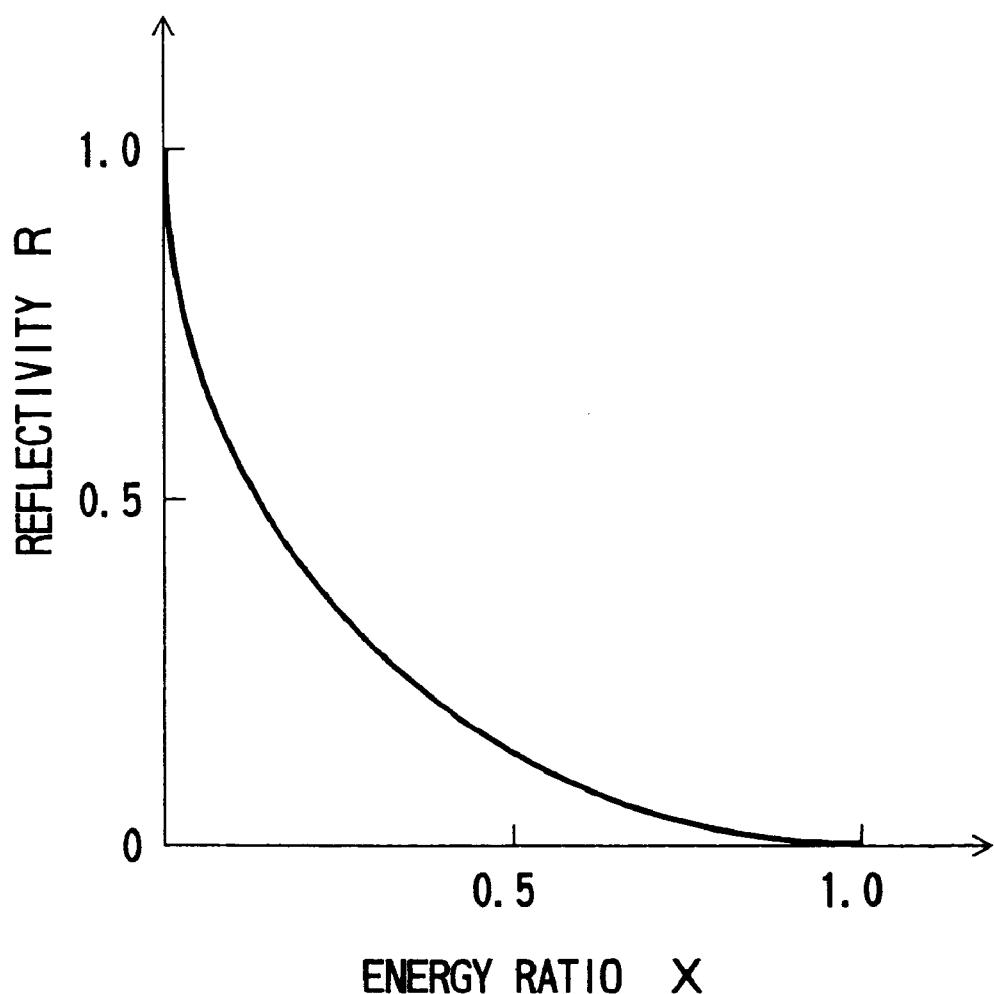
FIG. 2 is a graph showing a relation between an energy ratio x and a reflectivity R.
Figure 3A:
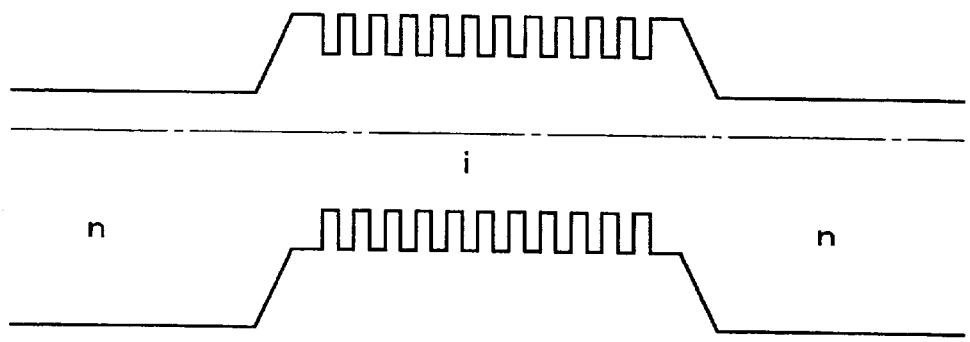
FIGS. 3A and 3B are views showing the energy diagram of a quantum-wave interference layer according to the first to third aspects of the present invention.
Figure 3B:
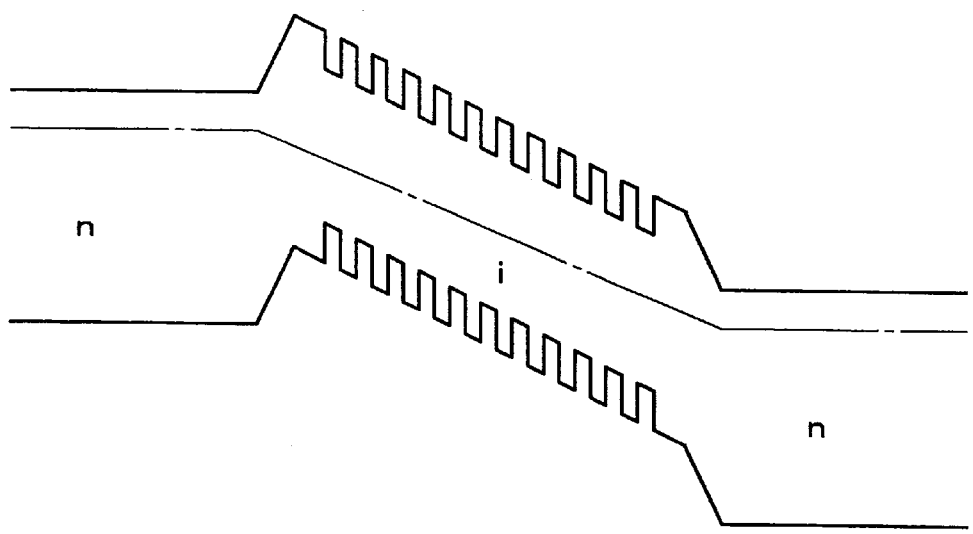
Figure 4:
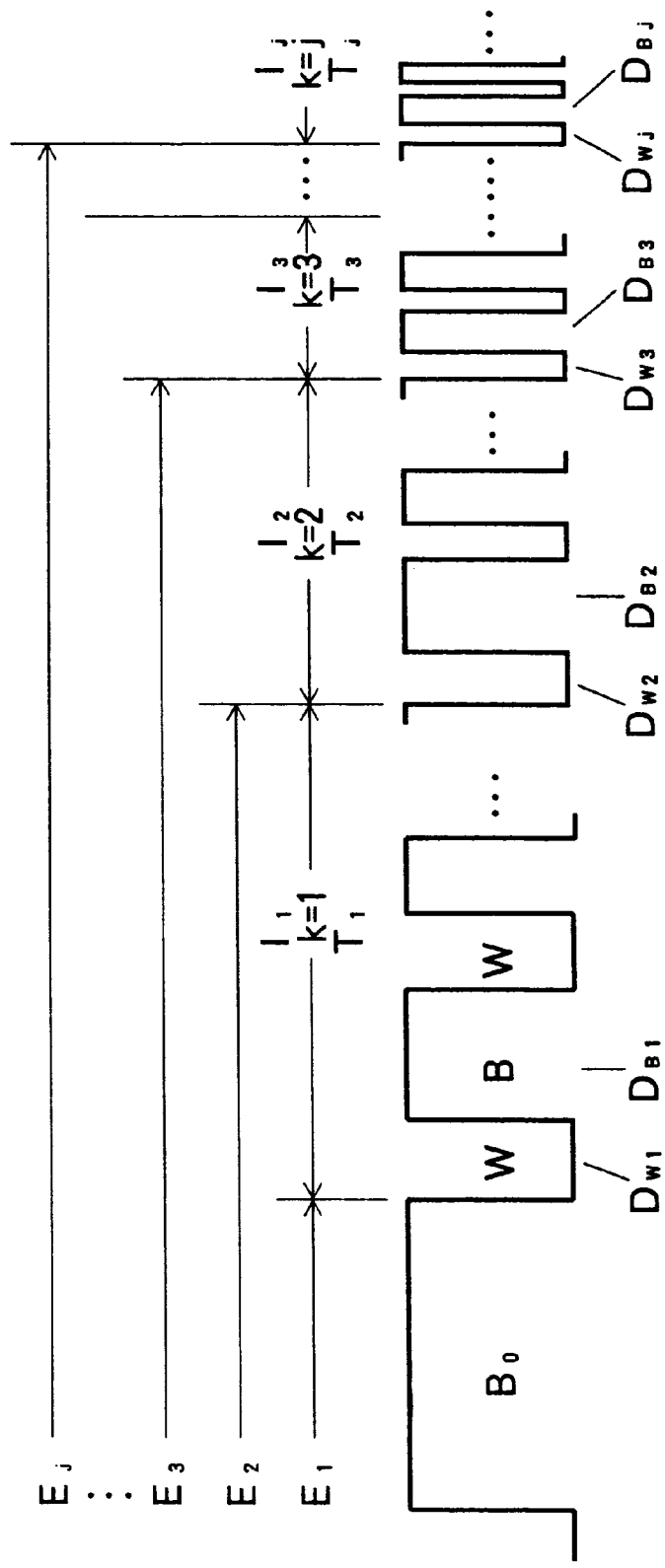
FIG. 4 is an explanatory view of partial quantum-wave interference layers $I_k$.
Figure 5A:
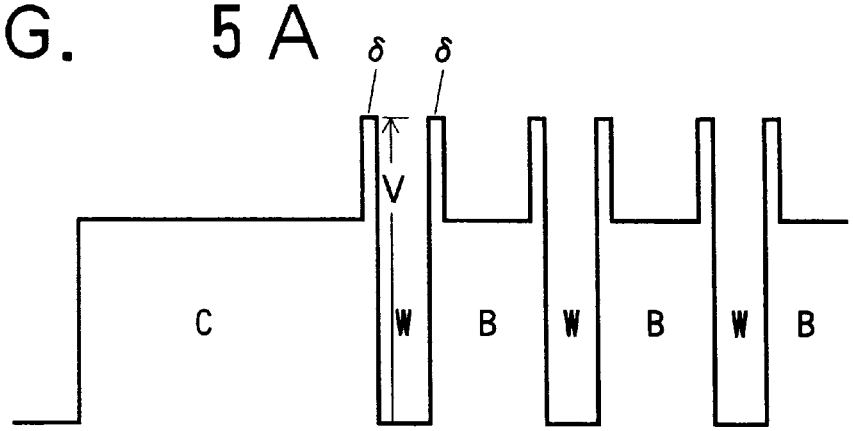
FIGS. 5A–5C are explanatory views of δ layers according to the the ninth, and the eighteenth aspects of the present invention.
Figure 5B:
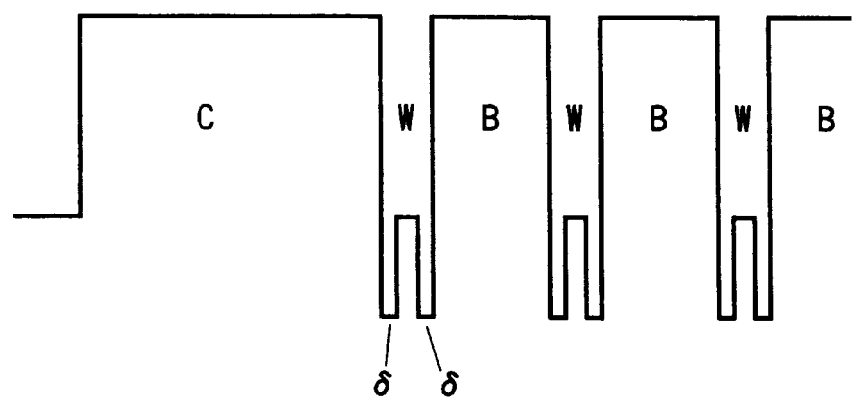
Figure 5C:
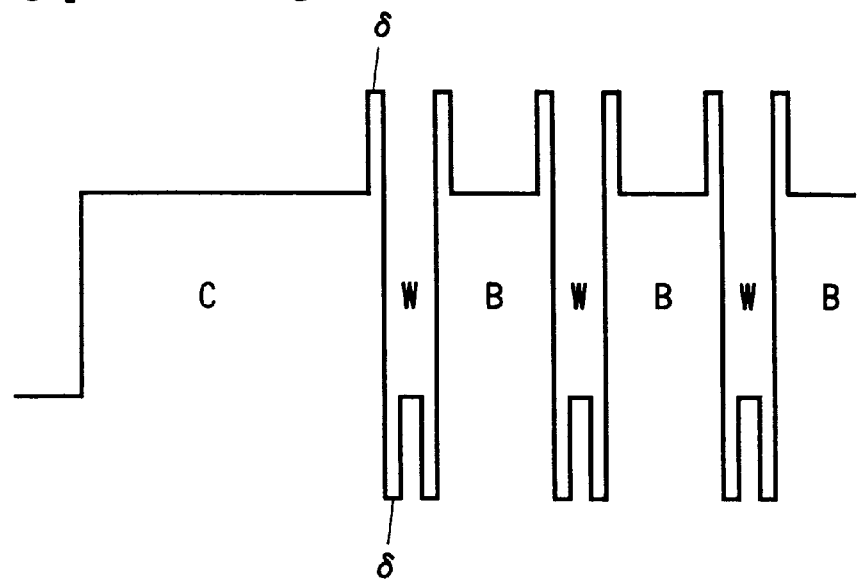

Alternatively, as shown in FIG. 4, in place of a quantum-wave interference layer in the i-layer, plurality of partial quantum-wave interference layers can be constructed with serial pairs of $T_1$ to $T_j$ to obtain the characteristics of a voltage-capacity.

In the embodiments, a δ layer is formed in the device 100. The δ layer improves a reflectivity at the interface between the first layer W and the second layer B. Alternatively, because the reflectivity can be improved by a maltipath reflection, the δ layer is not necessarily needed.

In the embodiments, four quantum-wave interference units $A_1$ to $A_4$ are connected in series, with a carrier accumulation layer C lying between each of the quantum-wave interference units. Alternatively, one quantum-wave interference layer can be made in an i-layer. In Example 1, the quantum-wave interference layer was formed to have a multi-layer structure including $Ga_{0.51}In_{0.49}P$ and $Al_{0.51}In_{0.49}P$. Alternatively, the quantum-wave interference layer can be made of two combinations of quaternary compounds such as $Al_xGa_yIn_{1-x-y}P$, selecting different arbitrary composition ratio within the range of $0 \leq x \leq 1$, $0 \leq y \leq 1$, and $0 \leq x+y \leq 1$. Further alternatively, the quantum-wave interference layer can be made of arbitrary group III-V compound semiconductor, group II-VI compound semiconductor, Si and Ge, and semiconductors of other hetero-material.

In the embodiment, an i-layer is a non-doped layer. Alternatively, a small amount of donor impurity or acceptor impurity can be doped with the i-layer. And also pip structure can be used in which i-layer has a quantum-wave interference layer with respect to holes.

EXAMPLE 2

Figure 12:
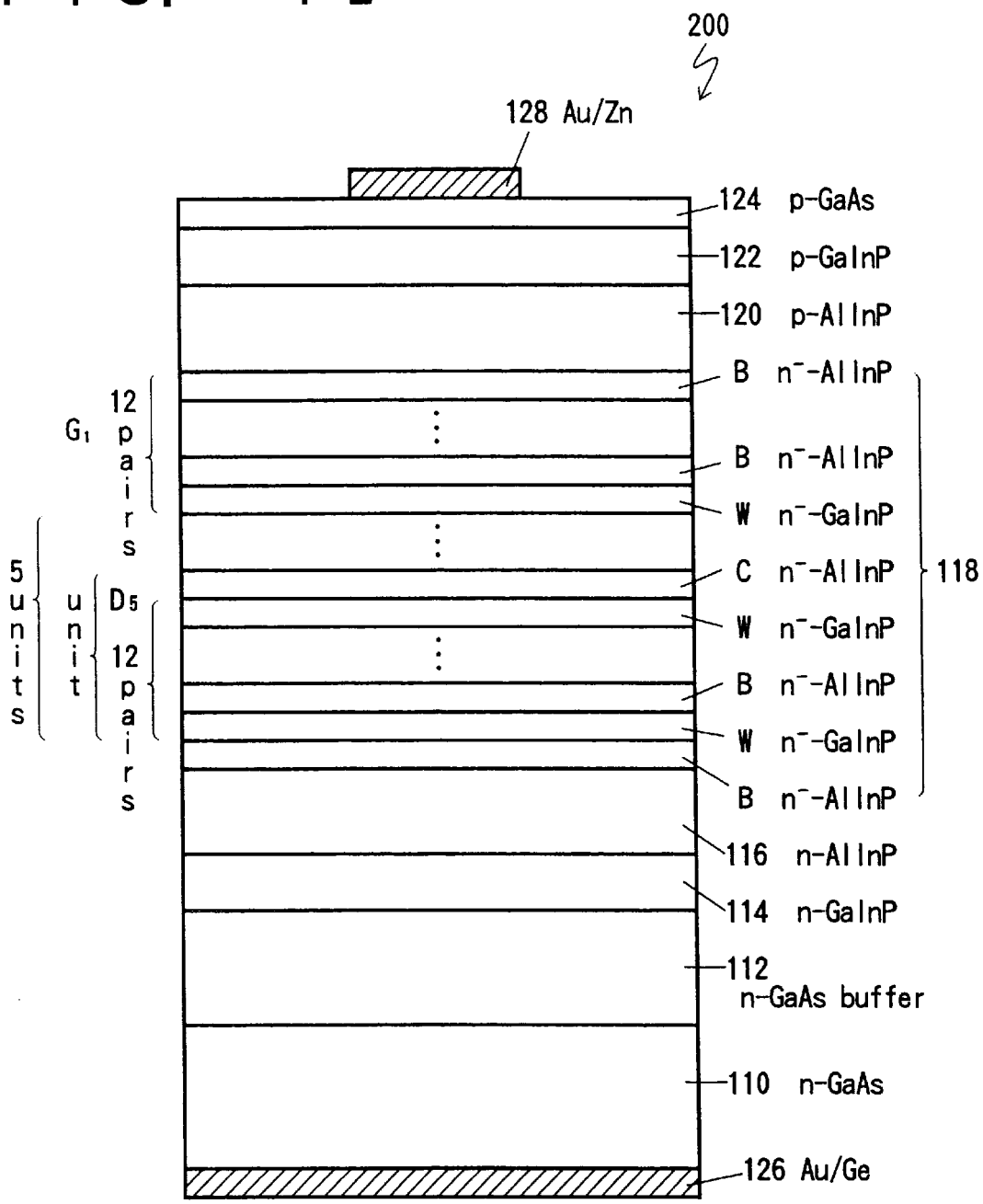
FIG. 12 is a sectional view showing a first exemplary structure of a pn⁻n variable capacity device 200 in Example 2.

FIG. 12 is a sectional view of a variable capacity device 200 in which a quantum-wave interference layer is formed in a n⁻-type layer. The variable capacity has a substrate 110 made of gallium arsenide (GaAs). A GaAs buffer layer 112 of n-type conduction, having a thickness generally of 0.3 μm and an electron concentration of $2 \times 10^{18}/cm^3$, is formed on the substrate 110. An n-$Ga_{0.51}In_{0.49}P$ contact layer 114 of n-type conduction, having a thickness generally of 0.13 μm and an electron concentration of $2 \times 10^{18}/cm^3$, is formed on the buffer layer 112. An n-$Al_{0.51}In_{0.49}P$ n-layer 116 of n-type conduction, having a thickness generally of 0.2 μm and an electron concentration of $1 \times 10^{18}/cm^3$, is formed on the contact layer 114. An n⁻layer 118, having an electron concentration which becomes smaller in accordance with approaching to a p-layer 120, is formed. The p-$Al_{0.51}In_{0.49}P$ p-layer 120 of p-type conduction, having a thickness generally of 0.2 μm and a hole concentration of $1 \times 10^{18}/cm^3$, is formed on the n⁻layer 118. A p-$Ga_{0.51}In_{0.49}P$ second contact layer 122 of p-type conduction, having a thickness generally of 0.13 μm and a hole concentration of $2 \times 10^{18}/cm^3$, is formed on the p-layer 120. A p-GaAs first contact layer 124 of p-type conduction, having a thickness generally of 0.06 μm and a hole concentration of $2 \times 10^{18}/cm^3$, is formed on the second contact layer 122. An electrode layer 126 made of gold and germanium (Au/Ge), having a thickness generally of 0.2 μm, is formed so as to cover the entire back of the substrate 110. Another electrode layer 128 made of gold and zinc (Au/Zn), having a thickness generally of 0.2 μm, is formed on some portion of the first p-type contact layer 124.

The n⁻layer 118 has an electron concentration of $3 \times 10^{18}/cm^3$. A quantum-wave interference layer $G_1$ having a multi-quantum layer structure with 12 pairs of a $Ga_{0.51}In_{0.49}P$ first layer W and an $Al_{0.51}In_{0.49}P$ second layer B is formed in the n⁻layer 118. $G_2, \ldots G_5$ are formed like $G_1$, and 5 quantum-wave interference units in total are formed in the n⁻layer 118.

FIGS. 8A to 8C shows a structure of the quantum-wave interference layer $G_1$ in detail. The first layer W has a thickness of 5 nm, and the second layer B has a thickness of 7 nm. A non-doped δ layer made of $Al_{0.33}Ga_{0.33}In_{0.33}P$, having a thickness of 1.3 nm, is formed at each interface between the first layer W and the second layer B.

A non-doped $Al_{0.51}In_{0.49}P$ carrier accumulation layers $C_1$ to $C_4$, having a thickness of 14 nm, is formed between any quantum-wave interference units $G_i$ and $G_{i+1}$, respectively, as shown in FIG. 11. A thickness of the first layer W and that of the second layer B are determined according to Eqs. 3 and 4, respectively, on condition that no external voltage is applied thereto.

The second layers B which contact to the p-layer 120 and the n-layer 116 have a thickness of 0.05 μm, respectively. The substrate 110 has a diameter of 2.0 inches and the normal direction of its main surface is offset toward the [011] axis by 15 degree from the (100) plane.

The variable capacity device 200 was manufactured by gas source molecular beam epitaxial deposition (GS-MBE) which is an epitaxial growth method under extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$. Alternatively, metal organic chemical vapor deposition (MOCVD) can be applied in place of GS-MBE.

Figures 11A, 11B, 11C:
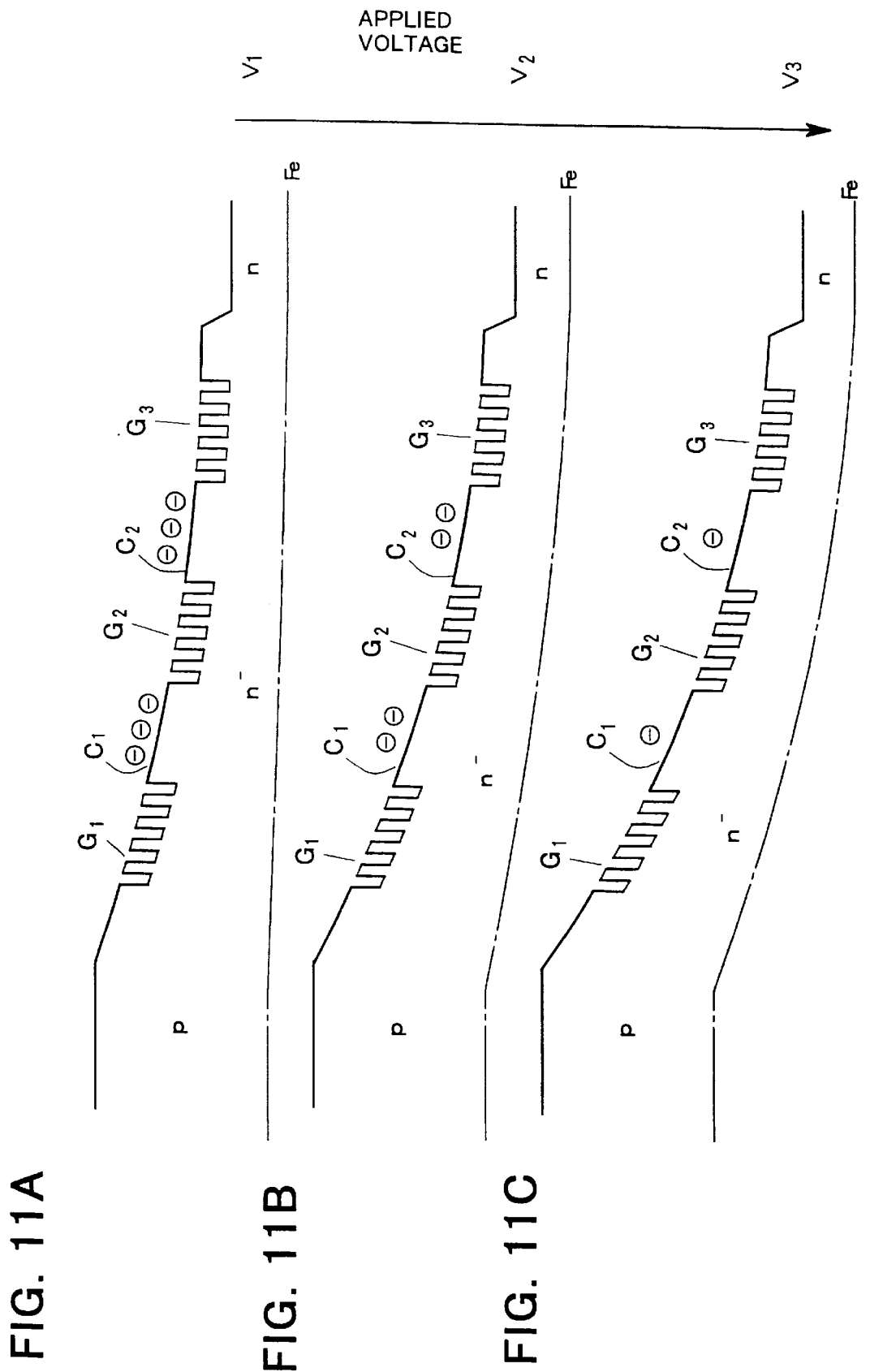
FIGS. 11A–11C are explanatory views showing the energy diagrams of the i-layer of the diode according to the present invention.

FIG. 11A shows an electric potential gradient occurring in the n⁻-layer 118 because of a higher resistivity compared with the p-layer 120 or n-layer 116 on the condition that a backward voltage is applied to the interface between the p-layer 120 and the n-layer 116 of the variable capacity device 200. Although the δ layer is not shown in FIGS. 11A to 11C, it is present at each interface between the first layer W and the second layer B, as shown in FIGS. 8A to 8C. Although only two carrier accumulation layers $C_1$ and $C_2$ are shown in FIGS. 11A to 11C, four exist from $C_1$ to $C_4$. Although only five pairs of layers in each of quantum-wave interference units are shown in FIGS. 11A to 11C, they exist in twelve pairs. Each quantum-wave interference units $G_1$ to $G_5$ reflects electrons when an external voltage is in the range of 0 to $V_1$ as shown in FIG. 11A. At this stage, electrons which exists in the n⁻-layer 118 are not conducted in the n⁻-layer 118 and are confined in each carrier accumulation layers $C_1$ to $C_4$, respectively. As a result, an effective thickness of a depletion layer is smaller, and an electrostatic capacity between the electrodes 126 and 128 is larger.

When the applied voltage V between the electrodes 126 and 128 become larger, a kinetic energy of electrons become larger and quantum-wavelength become smaller. That becomes not to satisfy the condition in which each quantum-well interference layers $G_1$ to $G_5$ reflects electrons. Accordingly, electrons are conducted and a electron concentration of each carrier accumulation layers $C_1$ to $C_4$ is decreased. Because each carrier accumulation layers $C_1$ to $C_4$ becomes a depletion layer, which means that equivalently the thickness of the depletion layer in the n⁻-layer 118 becomes larger, the capacity of the variable capacity device 200 decreases. Thus by applying a larger applied voltage V, the capacity can be decreased.

Figure 13:
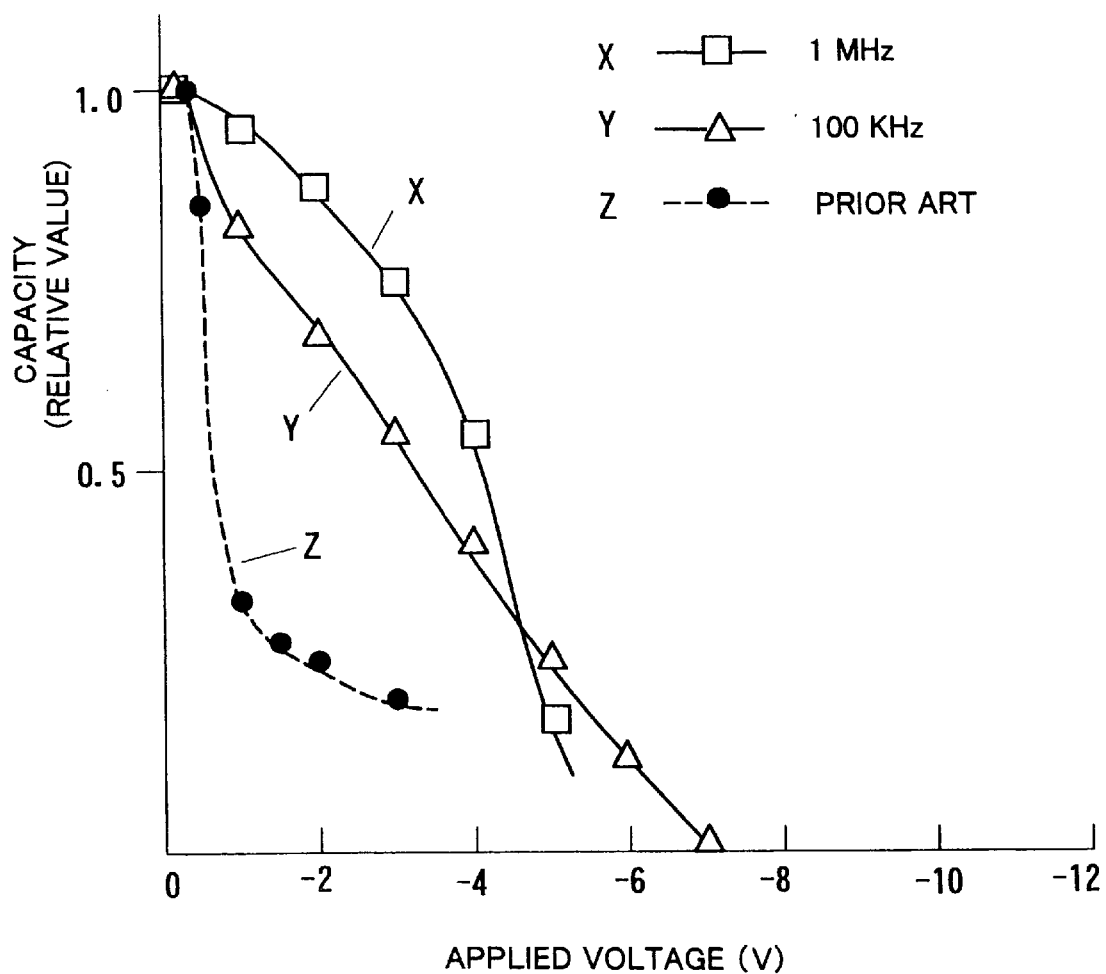
FIG. 13 is a graph showing a voltage characteristic of an alternating current capacity of the variable capacity device in Example 2.

Capacity value with respect to alternating current when a voltage V was applied as a bias voltage was measured by varying the respective value of the applied voltage V. FIG. 13 shows a result when the alternating current is fixed at 100 kHz and 1 MHz. A characteristics X shows a curve when the alternating current is 1 MHz. A characteristics Y shows a curve when the alternating current is 100 kHz. And a characteristics Z shows a curve of a voltage-variable capacity device in the prior art. When the applied voltage V is over 1.0 V, the decrease of capacity value Z is saturated. As shown in FIG. 13, a dynamic range of variable capacity of the present invention is wider compared with that of the prior art, although a voltage-variation rate of capacity becomes smaller.

EXAMPLE 3

Figure 14:
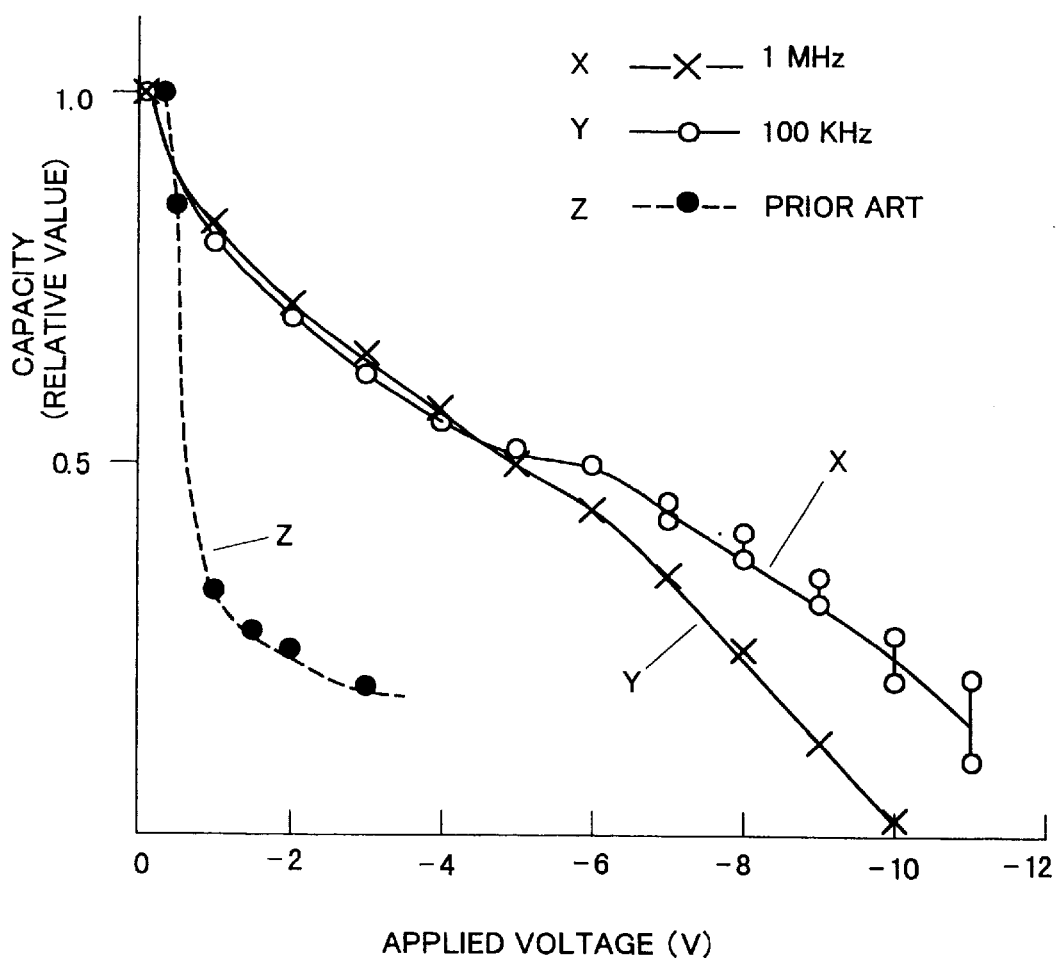
FIG. 14 is a graph showing a voltage characteristic of an alternating current capacity of the variable capacity device in Example 3.

In this embodiment, a variable capacity device has a structure as same as that of the variable capacity device 200 of FIG. 12. A thickness of each carrier accumulation layers $C_1$ to $C_4$ is duplicated to 8 nm and a measured capacity is shown in FIG. 14. Comparing FIG. 13 with FIG. 14, a voltage-variation rate of capacity becomes smaller in accordance with a thickness of each carrier accumulation layers $C_1$ to $C_4$ being larger. The dynamic range of capacity of both obtained devices are improved to be wider compared with that of the prior art.

In the embodiments, a δ layer is formed in the device 200. The δ layer improves a reflectivity at the interface between the first layer W and the second layer B.

Alternatively, because the reflectivity can be improved by a maltipath reflection, the δ layer is not necessarily needed.

In the embodiments, five quantum-wave interference units $G_1$ to $G_5$ are connected in series, with a carrier accumulation layer C lying between each of the quantum-wave interference units. Alternatively, one quantum-wave interference layer can be made in an n⁻layer without forming a carrier accumulation layer C. Number of the quantum-wave interference units of a multi-layer structure is arbitrary.

In Examples 2 and 3, the quantum-wave interference layer was formed to have a multi-layer structure including $Ga_{0.51}In_{0.49}P$ and $Al_{0.51}In_{0.49}P$. Alternatively, the quantum-wave interference layer can be made of two combinations of quaternary compounds such as $Al_xGa_yIn_{1-x-y}P$, selecting different arbitrary composition ratio within the range of $0 \leq x \leq 1$, $0 \leq y \leq 1$, and $0 \leq x+y \leq 1$. Further alternatively, the quantum-wave interference layer can be made of group III–V compound semiconductor, arbitrary group II–VI compound semiconductor, Si and Ge, and semiconductors of other hetero-material.

In the embodiment, a variable capacity having an nn⁻p junction structure is shown. Alternatively, a quantum-wave interference layer, which interferes quantum-waves of holes, can be formed in the p⁻layer of an np⁻p junction structure. Also alternatively, a quantum-wave interference layer, which interferes quantum-waves of electrons or holes, can be formed in the i-layer of an nip structure. Further alternatively, quantum-wave interference units, which interfere quantum-waves of electrons and holes, respectively, can be formed in the i-layer of the nip structure.

Figures 15A, 15B, 15C:
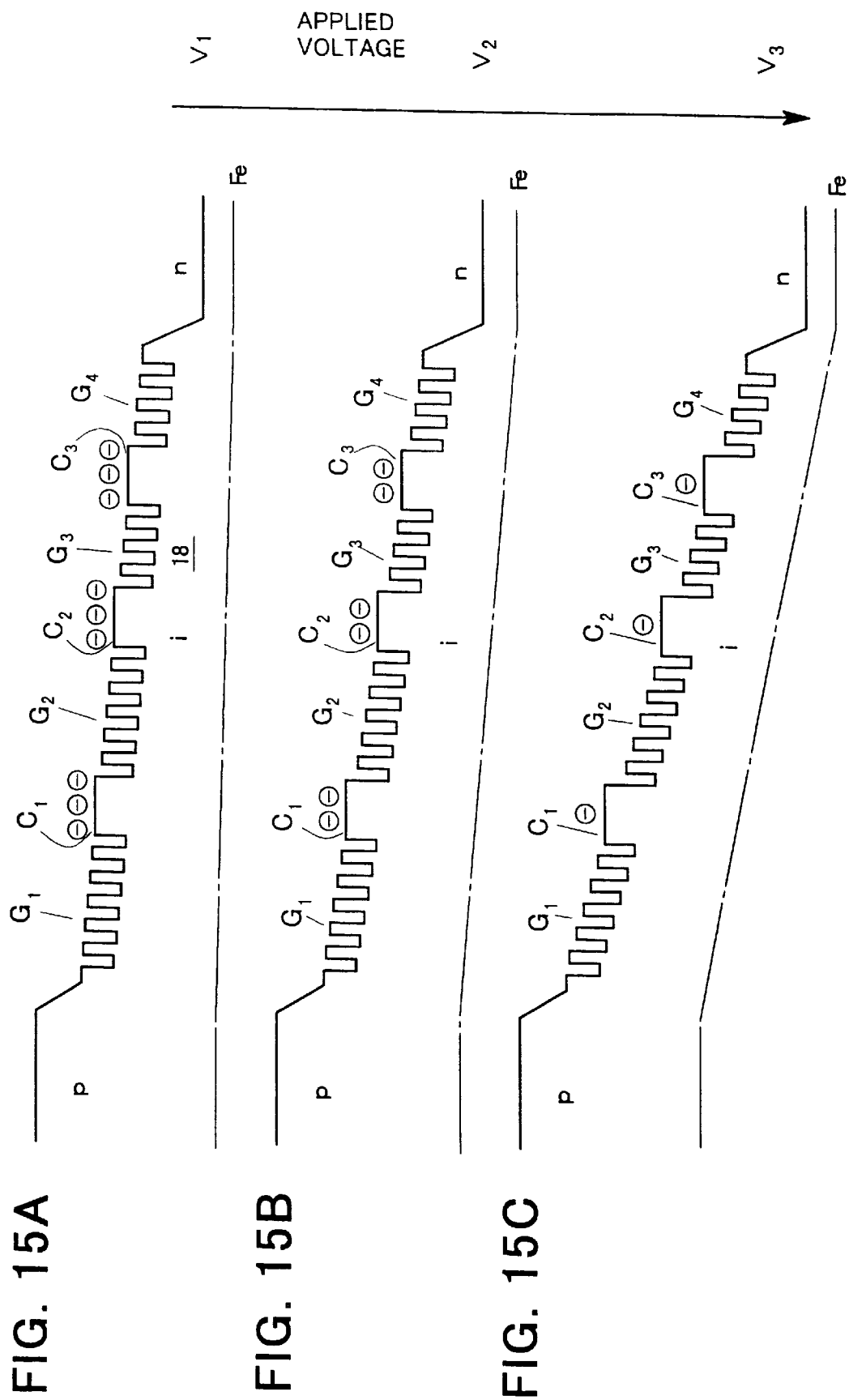
FIGS. 15A–15C are explanatory views showing the energy diagrams of the i-layer of a diode having a pin structure according to the present invention.

FIG. 15 shows a conduction band of a variable capacity device, having a pin structure. A quantum-wave interference layer of electrons is formed in an i-layer of the device. According to a backward voltage applied to the device being larger, carriers which exist in carrier accumulation layers decrease, and according to a thickness of a depletion layer being larger, a capacity becomes smaller.

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority documents, filed in Japan on Feb. 6, 1998 and Feb. 24, 1998, the entire contents of which are incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A variable capacity device having an nin or pip junction, comprising:

an i-layer having a quantum-wave interference layer which has plural periods of a pair of a first layer and a second layer, said second layer having a wider band gap than said first layer;

wherein the thickness of said first layer ($D_W$) is determined by the equation:

$$D_W = n_W \lambda_W \lambda_W / 4,$$

where $n_W$ is an odd number and $\lambda_W$ is a quantum-wave wavelength of carriers injected in the first layer given by the equation:

$$\lambda_W = h/(2m_W(E+V))^{1/2},$$

where h is Plank's constant, $m_W$ is the effective mass of said carriers in said first layer, V is a difference in carrier potential energy between said second layer and said first layer, E is the kinetic energy of carriers in said second layer and $E \leq V/9$;

the thickness of said second layer ($D_B$) is determined by the equation:

$$D_B = n_B \lambda_B / 4,$$

where $n_B$ is an odd number and $\lambda_B$ is a quantum-wave wavelength of carriers injected in the second layer given by the equation:

$$\lambda_B = h/(2m_B E)^{1/2},$$

where $m_B$ is the effective mass of said carriers in said second layer; and the carriers in said first and second layers are selected from the group consisting of electrons and holes.

2. A variable capacity device according to claim 1, wherein a kinetic energy of said carriers which determines said quantum-wave wavelength is set near the bottom of a conduction band of said second layer when carriers are electrons and is set near the bottom of a valence band of said second layer when carriers are holes.

3. A variable capacity device according to claim 2, wherein plural quantum-wave interference units are formed in said i-layer at an arbitrary interval.

4. A variable capacity device according to claim 3, wherein a carrier accumulation layer, which accumulates carriers, is formed at an every intermediate area between respective said quantum-wave interference units.

5. A variable capacity device according to claim 4, wherein said carrier accumulation layer has the same band gap as that of said second layer.

6. A variable capacity device according to claim 2, wherein a thickness of said first layer and a thickness of said second layer of said quantum-wave interference layer are determined based on a quantum-wave wavelength of conducted carriers in each layer, respectively, when a predetermined value of an electric field is applied to said i-layer.

7. A variable capacity device according to claim 1, wherein plural quantum-wave interference units are formed in said i-layer at an arbitrary interval.

8. A variable capacity device according to claim 7, wherein a carrier accumulation layer, which accumulates carriers, is formed at an every intermediate area between respective said quantum-wave interference units.

9. A variable capacity device according to claim 8, wherein said carrier accumulation layer has the same band gap as that of said second layer.

10. A variable capacity device according to claim 1, wherein a thickness of said first layer and a thickness of said second layer of said quantum-wave interference layer are determined based on a quantum-wave wavelength of conducted carriers in each layer, respectively, when a predetermined value of an electric field is applied to said i-layer.

11. A variable capacity device according to claim 10, further comprising:

a δ layer between said first layer and said second layer, said δ layer being thinner than said first layer and said second layer, and having an energy band gap that is different from said first and second layers.

12. A variable capacity device according to claim 1, further comprising:

a δ layer between said first layer and said second layer, said δ layer being thinner than said first layer and said second layer, and having an energy band gap that is different from said first and second layers.

* * * * *